United States Patent [19]

Reger

[11] Patent Number: 4,641,132
[45] Date of Patent: Feb. 3, 1987

[54] CONDITION-RESPONSIVE SWITCHING CIRCUIT

[75] Inventor: Philip R. Reger, Newtown Square, Pa.

[73] Assignee: American Manufacturing Company, Inc., King of Prussia, Pa.

[21] Appl. No.: 652,501

[22] Filed: Sep. 20, 1984

[51] Int. Cl.$^4$ ............................................. G08B 21/00
[52] U.S. Cl. .................................... 340/540; 307/116; 361/179; 340/693
[58] Field of Search ................ 340/540, 693; 307/116; 361/179

[56] References Cited

U.S. PATENT DOCUMENTS

| | | | | |
|---|---|---|---|---|
| 3,932,774 | 1/1976 | Buck | ............................. | 307/252 W |
| 3,932,803 | 1/1976 | Buck | ............................. | 307/252 P |
| 4,100,479 | 7/1978 | Buck | ............................. | 323/19 |
| 4,110,678 | 8/1978 | Buck | ............................. | 307/252 D |
| 4,135,124 | 1/1979 | Buck | ............................. | 307/252 P |
| 4,138,709 | 2/1979 | Colnill | ............................. | 307/116 |

Primary Examiner—Glen R. Swann, III
Attorney, Agent, or Firm—Nelson E. Kimmelman; Louis Weinstein

[57] ABSTRACT

This circuit includes a DC source in series with a load to be energized, the DC source also being coupled to a constant-current circuit coupled to the input of an output-signal-generating means. The latter produces an output signal in response to the detection by an associated sensor of a changing condition monitored by the sensor. When the signal-generating means detects a change, an SCR coupled to the DC source is turned on thereby by-passing all of the DC from said source around said constant current source. Simultaneously, the signal-generating means causes an associated LED to emit a light signal.

6 Claims, 1 Drawing Figure

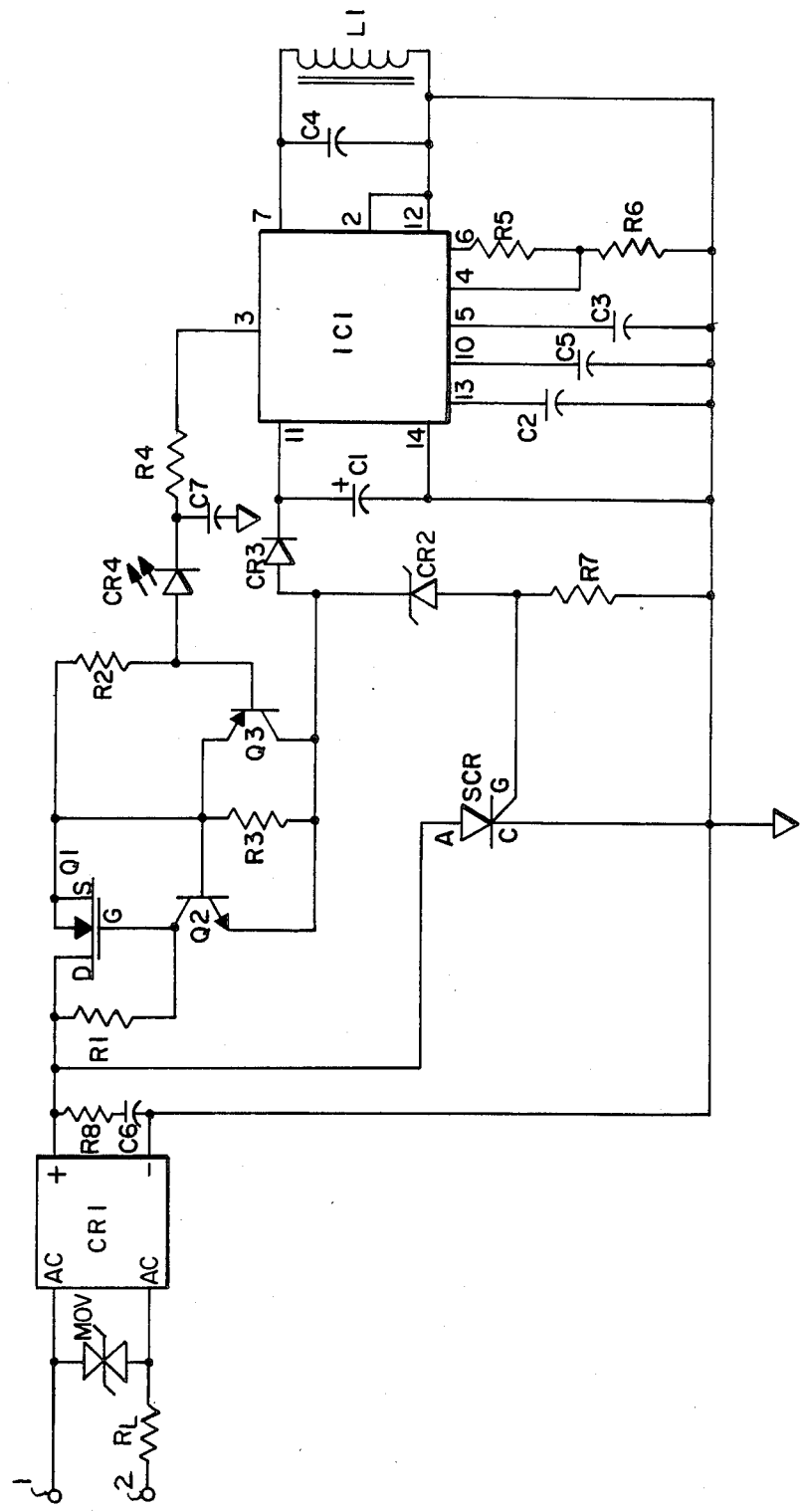

CONDITION-RESPONSIVE SWITCHING CIRCUIT

BACKGROUND OF THE INVENTION

1. Field of the Invention

This invention relates to electronic circuits for energizing a load. In particular, it relates to such a circuit used in conjunction with a sensing element such as a proximity switch.

2. Prior Art

Circuits are known in which a constant current or current-limiting subcircuit is employed and is adapted to be coupled to a proximity detector and to a load which is energized in response to the detection of predetermined metallic components by the proximity detector. One such circuit is shown in the Buck U.S. Pat. No. 3,932,803 in which a constant current source is in series with a voltage breakdown device. That circuit uses a single SCR which fires to energize a load when metal is detected yet maintains a sufficient voltage across the breakdown device to keep the detector's oscillator-amplifier continuously operative. In the Buck circuit there is a flow of current through the Zener diode as well as through the SCR and its associated components causing an unnecessary second voltage drop which reduces the electrical efficiency of the circuit. Buck's circuit has the SCR in series with the voltage breakdown device. Another U.S. Pat. No. 4,135,124 by Buck also calls for an SCR in series with a breakdown device and therefore has two voltage drops in the same branch. The same is true with respect to Buck U.S. Pat. Nos. 3,932,774 and 4,110,678. Buck U.S. Pat. No. 4,100,479 discloses a constant current source and a circuit which includes two SCRs, the second one being substantially across the constant current source and across the DC supply source. However, that circuit requires two Zener diodes in addition to two SCRs and is therefore more complex and possibly more expensive than the one illustrated in this application.

It is therefore among the objects of the present invention to provide a circuit which:

1. Enables a greater current energization of a load circuit than those known in the prior art.
2. Requires only a single SCR and a single Zener diode.
3. Has only a single voltage drop across the DC supply circuit and the constant current source when its SCR is conductive.
4. Has other advantages as will be explained below.

SUMMARY OF THE INVENTION

In a circuit having a constant current source disposed across a DC source in series with a load and a voltage breakdown device in series with the constant current source, means including a voltage-responsive switching means across said DC source for by-passing substantially all of said DC around said constant current source in response to a signal produced by a detecting circuit coupled to said switching means when said detecting circuit senses a change in a condition being monitored.

BRIEF DESCRIPTION OF THE DRAWINGS

The sole FIGURE is a schematic diagram of the circuit in accordance with the present invention.

DETAILED DESCRIPTION OF THE DRAWINGS

Referring to the sole FIGURE, a pair of input terminals 1 and 2 are shunted by a metallic oxide varistor MOV to protect against excessive voltage. MOV is also in parallel with the AC inputs to a DC source CR1. CR1 may be a bridge circuit of conventional construction, for example. At its output terminals marked "+" and "−", respectively, a series combination of a resistor R8 and capacitor C6 is connected to provide a noise filter. To the same positive terminal, there is also a connection to the anode of a silicon control rectifier SCR whose cathode is connected to ground and whose gate is connected, via a resistor R7 to ground.

Also coupled to the output of the DC supply is a current-limiting (constant current) subcircuit comprising Q1, Q2, R1 and R3. R3 has a very high value of resistance and R1 has one end connected to the drain of Q1 which is an FET. Current through R1 normally tends to keep Q1 on at all times. The gate of Q1 is connected to the other end of resistor R1 and to the collector of transistor Q2 whose emitter is connected to the lower end of resistor R3. The base of transistor Q2 is connected to the upper end of resistor R3 and to the source of Q1. Q2, when on, tends to bias the gate of Q1 to turn it off. The emitter of Q1 is likewise connected to the source as shown.

The constant current subcircuit is coupled via a resistor R2 to the anode of an LED CR4, the lower end of the resistor R2 also being connected to the base of transistor Q3 whose emitter is connected to the source of Q1. The collector of Q3 is connected to the lower end of resistor R3. The collector of Q3 is also connected to the cathode of Zener diode CR2 which regulates the voltage at the output of the power supply. Its anode is connected to the gate of the SCR and the upper end of resistor R7.

CR4 turns on when current flows through Q1 and then through resistor R4 which is connected to a chip IC1. This chip is designed for use with a proximity detecting head and when no metal is detected by it the circuit will oscillate. The oscillation will stop when it responds to the effects of Eddy currents on the HF losses of the coil L1 of the tank circuit (L1, C4) associated with chip IC1.

Ordinarily, in the non-detecting mode, the current supply from DC source CR1 through R1 is sufficient to bias the gate of Q1 so as to enable it to conduct. Conduction of Q1 produces a current through R3 which causes the base of Q2 to go positive so that Q2 begins to turn on. As it does, the voltage on the gate of Q1 tends to turn it off so that the current through R3 starts to decrease. The interrelation of Q1, Q2 and R3 functions to produce a closed-loop negative feedback which goes to equilibrium so that current will flow through Q2 and R3 in parallel and also through CR2. The sum of currents going through CR3 and CR2 is a function of the base-emitter voltage of Q2 divided by the value of R3. In one embodiment it is constantly limited to about 1–2 milliamps, thus limiting the charging current applied to capacitor C1 via blocking diode CR3 when the system is operating in the non-detecting mode. C1 is the power supply filter which supplies current to chip IC1 when metal has been detected. Also, in the non-detecting state, current through R2 tends to keep transistor Q3 from conducting and from effectively shorting out R3.

In the non-detecting mode it is the current through CR2 and R7, which has a low resistance, which generates a sufficient positive voltage at its upper end to bias the gate of the SCR to keep it non-conductive. The low value of R7 minimizes the possibility that the SCR will inadvertently be turned on by temperature-voltage changes.

Within the chip IC1, there is a transistor subcircuit which is connected to R4 and which becomes conductive in response to the detection of metal by the tank circuit, R4 also serving to limit the base current of Q3. In the detection mode, it is the function of the SCR to act as a low impedance current bypass for shorting out the current limiting subcircuit so that it cannot produce a DC input to the chip IC1. When shorted out, it is the current on capacitor C1 which keeps the chip IC1 energized.

In the detection mode, the transistor subcircuit in IC1 turns on, and it will, in turn, cause more current to flow through R2 from Q1. Then the voltage across R2 changes, causing more current into the base of Q3 so the latter becomes more conductive, which effectively shorts out resistor R3 thus turning off transistor Q2. In turn, when Q2 turns off, there will be a large increase in current in the drain-source circuit of Q1 which passes through Q3, Zener diode CR2 and R7. This increased current causes the gate of the SCR to go increasingly positive and thereby considerably increases conduction through it. This low impedance path across the DC output of the bridge rectifier CR1 increases the current through the load $R_L$.

In the present circuit, unlike some of the prior art patents, the SCR and the Zener diode CR2 are in parallel. Thus, when the present circuit is in the detecting state, there is one less breakdown device in series with the load and hence there is a lesser voltage drop. In some prior art circuits, when the variable impedance device becomes more conductive, there is nonetheless another path through a Zener diode or equivalent device, so that the voltage drop of the Zener diode must be added to the voltage drop of the SCR and bridge in series with the load. Thus, the load does not receive the maximum possible line voltage and therefore does not get the maximum amount of current through it.

In the present circuit, the output of the chip IC1 is not connected to the variable impedance SCR; rather it controls the constant current source.

GENERAL REMARKS

In some applications it may be desirable to provide temperature compensation for the current limiter subcircuit. This may be accomplished by inserting a germanium or Schottky diode in series with R3, in which case the value of R3 must be modified accordingly. Alternatively, R3 can be a linear, negative temperature coefficient resistor.

As shown, one end of resistor R4 may be connected to terminal 1 of the IC1 for operation in the normally-closed mode. In order to provide for actuation of a normally open load which is the way the load is arranged in the circuit shown in the sole drawing, the terminal of R4 is connected to terminal 3 of the particular chip IC1 instead of to terminal 1 thereof. The description above of the operation of the circuit has assumed a normally open load.

Capacitor C2 is optionally provided to introduce a delay on start-up of the circuit. It reduces the edge steepness of the output signals and controls the switching period of the current source internal to IC1.

Capacitor C5 is a decoupling capacitor used for frequencies lower than 500 KHz.

Capacitor C3 is a filter capacitor for the detector chip IC1.

Capacitor C7 is a noise filter.

R5 and R6 are hysteresis and sensitivity adjustment resistors, respectively.

In the practice of the present invention, the identification and values of the various components thereof given below in tabular form have proved to be quite satisfactory in the successful operation of the circuit.

| Item | Description/Value |
|---|---|
| MOV | Varistor |
| CR1 | IDN 340 |
| CR2 | BZX84C6V2 |
| CR3 | BAS 16 |
| CR4 | MV5777C |
| R1 | 5.6 meg |
| R2 | 4.7K |
| R3 | 390 ohms |
| R4 | 270 ohms |
| R5 | 6.8K, 4.7K, 15K 10K, 8.2K, 18K |
| R6 | 47, 180, 470 100, 270, 1K |
| R7 | 47 ohms |
| R8 | 47 ohms |
| Q1 | IVN6300ANT |
| Q2 | BSR17 |
| Q3 | BCX17 |
| SCR | TECCOR S401E TAG 607-400 |
| IC1 | TDE0160 (Thomson) |
| C1 | 22 mfd |
| C2 | .1 mfd |
| C3 | 1000 pf |
| C4 | 1000 pf or 3300 pf |
| C5 | .01 mfd |
| C6 | .01 mfd |
| L1 | |

What is claimed is:

1. An electronic circuit for monitoring a predetermined condition and adapted to be used with a source of DC in series with a current-responsive load, comprising:

(a) a constant current source coupled to said DC source, (b) output signal generating means adapted to be coupled to a means for detecting a change in said condition whereupon it produces a predetermined output signal, (c) a first variable impedance means coupled to said constant current source and to a first output terminal of said signal generating means, said first variable means also being coupled to a first input terminal of said signal generating means, (d) an electronic voltage breakdown device also coupled to said first variable impedance means, (e) a resistive means in series with said breakdown device, (f) a second variable impedance means disposed across said DC source and coupled to the junction of said breakdown device and said resistive means, said second variable impedance means normally being in one conductive state when said (b) means is not producing said predetermined output signal and in a second conductive state when said predetermined output signal is being produced whereupon it provides a very low impedance current path across said constant current source and said voltage breakdown device.

2. The circuit according to claim 1 which is also adapted to be used with a detector for detecting said condition, said circuit further comprising a second resistive means coupled to said constant current source, to said first variable impedance means and to said output signal generating means for providing a current path from said constant current source and for increasing current through said first variable impedance means in response to the production of said output signal thereby diverting most current from said constant current source through said first variable impedance means, said breakdown device and said first-recited resistive means in series, the increased current through said first-recited resistive means causing said second variable impedance means to effectively short out said constant current source and increase current flow from said DC source through a load.

3. The circuit according to claim 1 wherein said constant current source comprises third and fourth variable impedance means coupled to one another, a second resistive means shunting said third variable impedance means, and a third resistive means across said first variable impedance means and also coupled to said fourth variable impedance means.

4. The circuit according to claim 2 with the addition of a light-emitting device coupled between said second resistive means and said output signal generating means for producing a light signal upon the occurrence of said output signal.

5. The circuit according to claims 1 or 2 wherein said second variable impedance means is voltage controlled and becomes highly conductive due to the generation of a higher voltage across said first-recited resistive means when increased current flows through the latter.

6. The circuit according to claim 5 wherein said second variable impedance means is an SCR whose gate is coupled to the junction of said breakdown device and said first resistive means.

* * * * *

UNITED STATES PATENT AND TRADEMARK OFFICE
CERTIFICATE OF CORRECTION

PATENT NO. : 4,641,132

DATED : February 3, 1987

INVENTOR(S) : Philip R. Reger

It is certified that error appears in the above-identified patent and that said Letters Patent is hereby corrected as shown below:

Column 1, line 34, change "4,110,678" to --4,100,479--.

Signed and Sealed this

Twenty-fifth Day of August, 1987

Attest:

DONALD J. QUIGG

Attesting Officer   Commissioner of Patents and Trademarks